(12) United States Patent
Rim

(10) Patent No.: US 9,249,523 B2
(45) Date of Patent: Feb. 2, 2016

(54) ELECTRO-POLISHING AND POROSIFICATION

(71) Applicant: Seung Bum Rim, Palo Alto, CA (US)

(72) Inventor: Seung Bum Rim, Palo Alto, CA (US)

(73) Assignee: SunPower Corporation, San Jose, CA (US)

( * ) Notice: Subject to any disclaimer, the term of this patent is extended or adjusted under 35 U.S.C. 154(b) by 159 days.

(21) Appl. No.: 14/039,597

(22) Filed: Sep. 27, 2013

(65) Prior Publication Data

US 2015/0090605 A1    Apr. 2, 2015

(51) Int. Cl.
   *C25F 3/30* (2006.01)
   *C25F 3/12* (2006.01)
   *H01L 21/02* (2006.01)
   *H01L 31/068* (2012.01)
   *H01L 31/18* (2006.01)
   *C25F 7/00* (2006.01)

(52) U.S. Cl.
   CPC ... *C25F 3/30* (2013.01); *C25F 3/12* (2013.01); *C25F 7/00* (2013.01); *H01L 21/0201* (2013.01); *H01L 21/0203* (2013.01); *H01L 31/0682* (2013.01); *H01L 31/1804* (2013.01); *H01L 31/1892* (2013.01)

(58) Field of Classification Search
   CPC .................................... C25F 3/12; C25F 3/30

USPC ................................................ 205/646, 665
See application file for complete search history.

(56) References Cited

U.S. PATENT DOCUMENTS

| | | | |
|---|---|---|---|
| 5,139,624 A * | 8/1992 | Searson et al. | 205/656 |
| 8,926,803 B2 | 1/2015 | Crafts et al. | |
| 2008/0280140 A1* | 11/2008 | Ferrari et al. | 428/402 |

FOREIGN PATENT DOCUMENTS

| | | |
|---|---|---|
| JP | 10079524 | 3/1998 |
| JP | 11214725 A | 8/1999 |
| JP | 2000332270 | 11/2000 |
| JP | 2000340966 | 12/2000 |

OTHER PUBLICATIONS

International Search Report and Written Opinion from PCT/US2014/056414 mailed Dec. 31, 2014, 9 pgs.

* cited by examiner

*Primary Examiner* — Nicholas A Smith
(74) *Attorney, Agent, or Firm* — Blakely Sokoloff Taylor Zafman LLP

(57) ABSTRACT

Forming a porous layer on a silicon substrate is disclosed. Forming the porous layer can include placing a silicon substrate in a first solution and conducting a first current through the silicon substrate. It can further include conducting a second current through the silicon substrate resulting in a porous layer on the silicon substrate.

19 Claims, 3 Drawing Sheets

ELECTRO-POLISHING AND POROSIFICATION

TECHNICAL FIELD

Embodiments of the subject matter described herein relate generally to semiconductors, silicon substrates and solar cells. More particularly, embodiments of the subject matter relate to semiconductors, solar cells and fabrication processes.

BACKGROUND

Semiconductors and silicon-based substrates are well known devices widely used in the semiconductor and electronics industry for various applications and devices. As an example, solar cells, a type of semiconductor type device, are well known devices for converting solar radiation to electrical energy. They can be fabricated on a semiconductor wafer using semiconductor processing technology. A photovoltaic cell or a solar cell includes P-type and N-type diffusion regions. Solar radiation impinging on the solar cell creates electrons and holes that migrate to the diffusion regions, thereby creating voltage differentials between the diffusion regions. In a backside contact solar cell, both the diffusion regions and the metal contact fingers coupled to them are on the backside of the solar cell. The contact regions and contact fingers allow an external electrical circuit to be coupled to and be powered by the solar cell. One or more embodiments pertain to photovoltaic cells or solar cells and photovoltaic fabrication processes. Such processes can include processing silicon substrates in preparation for subsequent solar cell processes as described below.

BRIEF SUMMARY

In one embodiment, a method for forming a porous layer on a first silicon substrate is disclosed. In some embodiments, the method includes placing a first silicon substrate in a first solution and conducting a first current through the first silicon substrate in the first solution. In one embodiment, the first solution can allow for the conduction of the first current through the first silicon substrate. The method can further include conducting a second current through the first silicon substrate resulting in a porous layer on the first silicon substrate.

In one embodiment, another method for forming a porous layer on a first silicon substrate can include placing a first silicon substrate in a first solution, conducting a first current through the first silicon substrate, and placing a first silicon substrate in a second solution. The method can further include forming a porous layer on the first silicon substrate by conducting a second current through the first silicon substrate.

In one embodiment, still another method for forming a porous layer on a first silicon substrate can include placing a first silicon substrate in an electro-polishing solution, electro-polishing the first silicon substrate by conducting a first current through the first silicon substrate and placing the first silicon substrate in a porosification solution. The method can further include forming a porous layer on the first silicon substrate by conducting a second current through the first silicon substrate.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
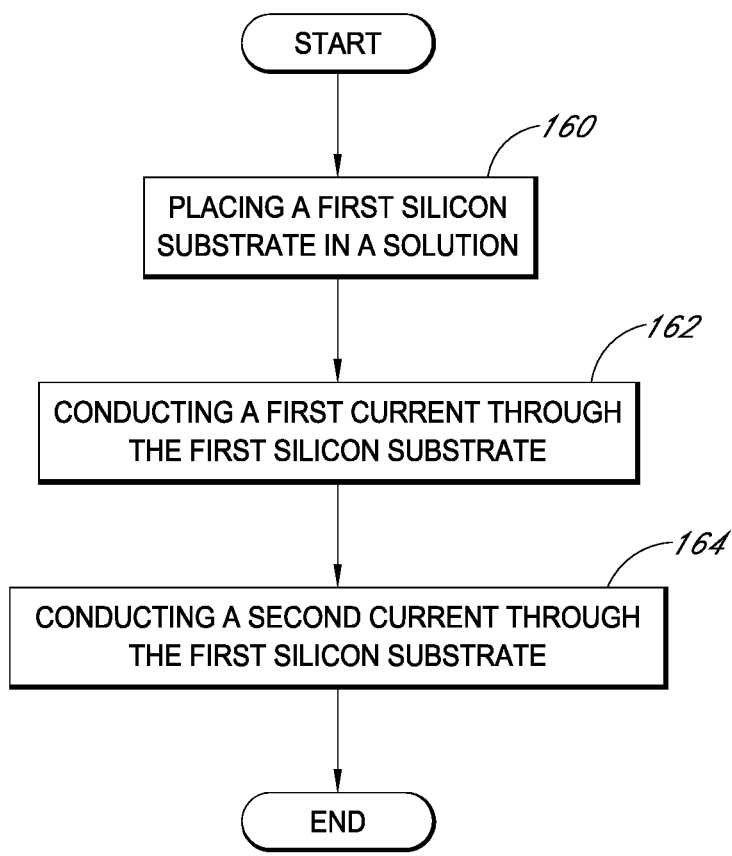
FIG. 1 is a flow chart representation of an example method for forming a porous layer on a silicon substrate.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Although much of the disclosure is described in terms of silicon substrates and semiconductor devices for ease of understanding, the disclosed techniques and structures apply equally to other semiconductor structures such as silicon wafers and their applications such as in photovoltaic cells or solar cells.

General techniques for porosification of silicon substrates require surface preparation, such as grinding or polishing of a silicon template or a silicon substrate. These additional process steps prior to the porosification process necessitate extra tool and process cost. Embodiments disclosed herein can address these difficulties and provide cost savings and efficiency improvement.

FIG. 1 illustrates a flow chart of an embodiment for a method of forming porous layer on a silicon substrate. In various embodiments, the method of FIG. 1 can include additional (or fewer) blocks than illustrated.

As shown at 160, a silicon substrate can be placed in a solution. In an example, the silicon substrate can have a thickness range of approximately 100 microns-1 millimeter. The solution can allow for the first current to be conducted through the silicon substrate. In one embodiment, placing the silicon substrate in the solution can include positioning the silicon substrate between two electrodes that are at least partially immersed in the solution. For example, in one embodiment the electrodes can be completely immersed in the solution. In another embodiment, one or more of the electrodes can be exposed outside of the solution. In another embodiment, the silicon substrate can act as one of the electrodes.

In one embodiment, the solution can be an electro-polishing solution or a porosification solution. Example solutions can include one or more of hydrofluoric acid (HF), isopropyl alcohol (IPA), and ethanol, among others.

At 162, a first current can be conducted through the silicon substrate. In one embodiment, conducting the first current through the silicon substrate can electro-polish the first substrate resulting in a polished layer on the substrate. In an embodiment, the current density of the first current can approximately be in the range of 1-100 mA/cm$^2$.

In various embodiments, the magnitude of the first current can be based on the size of the silicon substrate, the concentration of the solution, the composition of the solution, the amount of the solution relative to the size of the silicon substrate, and/or the size of a tank. In one embodiment, the current conducted at 162 can be associated with application of a high bias voltage. As used herein, a high bias voltage is associated with a higher current density (mA/cm$^2$) range as compared to a low bias voltage.

As shown at 164, a second current can be conducted through the silicon substrate. Conducting the second current through the silicon substrate can result in a porous layer on the silicon substrate. In an embodiment, before conducting the second current, the silicon substrate can be placed in a second solution that is of a different composition than the first solution. In other embodiments, the first solution can be of the same composition as the second solution or can even be the same solution (e.g., same solution used at 162 and 164). In one embodiment, the current density for the second current can approximately be in the range of 0.1-50 mA/cm$^2$.

Similar to the first current, the magnitude of the second current can be based on the size of the silicon substrate, the concentration of the solution, the composition of the solution, the amount of the solution relative to the size of the silicon substrate, and/or the size of the tank. In one embodiment, the second current conducted at 164 can be associated with a low bias voltage.

For example, the current density for the first current can approximately be in the range of 1-100 mA/cm$^2$. In one example, the current density for the second current can approximately be in the range of 0.1-50 mA/cm$^2$, resulting in a porous layer on the silicon substrate. In one embodiment, the first current can be equal to the second current.

In one embodiment, a single solution can be used in the tank, where the current can be varied by applying a high bias voltage, to form a polished layer on the silicon substrate, and by applying a low bias voltage to form a porous layer on the silicon substrate. In another embodiment, two different solutions can be used subsequently in combination with different current biases as mentioned above. In still another embodiment, separate tanks can be used with two separate solutions of the same composition. In yet another embodiment, separate tanks can be used with two or more different solutions. Example solutions can include one or more of hydrofluoric acid (HF), isopropyl alcohol (IPA), and ethanol, among others.

In various embodiments, conducting the second current through the first silicon substrate can result in a porous layer on the silicon substrate.

Figure 2:
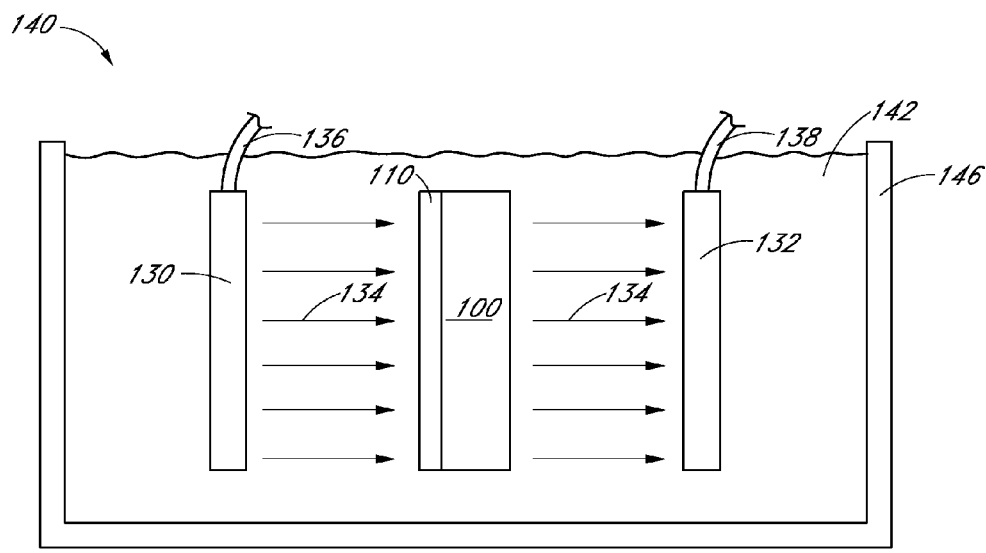
FIGS. 2 and 3 are cross-sectional representations of a substrate in a solution in accordance with some embodiments of forming a porous layer on a silicon substrate.

With reference to FIG. 2 a porosification setup is shown. The porosification setup 140 can include a porosification tank 146 and solution 142. In various embodiments, the solution 142 can be a porosification solution, an electro-polishing solution, and or be a solution applicable for both electro-polishing and porosification. In some embodiments, the solution 142 can include a chemical, such as hydrofluoric acid (HF), isopropyl alcohol (IPA), and/or ethanol. In an embodiment, the solution can be a first solution, where multiple solutions can be in the porosification process. In an embodiment, the HF concentration of the first solution can be in the range of 5%-70%.

In one embodiment, the porosification setup 140 can include a first connector 136 that can hold a first electrode 130 in place. Note that in some embodiments, the first connector 136 can be a conduit for current flow. Similarly, a second connector 138 can hold a second electrode 132 in place and in some embodiments, the second connector 138 can act as a conduit for current flow.

During a porosification process, a silicon substrate 100 can be positioned between the first electrode 130 and second electrode 132. In one embodiment, a third connector (not illustrated) can hold the silicon substrate 100 with the third connector acting as a conduit for current flow in some embodiments. During operation, a first current 134 can be conducted from the first electrode 130, through the first silicon substrate 100, to the second electrode 132. In one embodiment conducting the first current 134 can include electro-polishing the first silicon substrate and result in a polished layer 110 on the silicon substrate 100. In an embodiment, electro-polishing can include flattening the silicon substrate surface. In some embodiments, the first current 134 can be associated with a high bias voltage.

Figure 3:
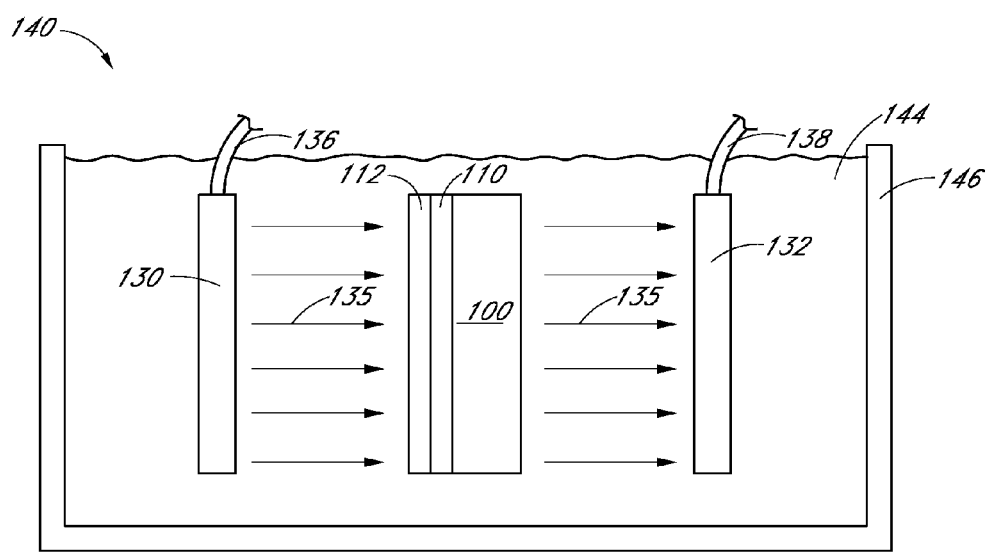

FIG. 3 illustrates the porosification setup of FIG. 2 with reference to conducting a second current 135 through the silicon substrate 100. As shown, the first electrode 130 is configured to conduct the second current 135 through the silicon substrate 100 resulting in a porous layer 112 on the first silicon substrate 100 (and in some embodiments, on the polished layer 110). In an embodiment, the porous layer 112 can have multiple layers, such as one with low porosity and one with high porosity. In the embodiment where the porous layer 112 can have multiple layers, the high porosity layer can be formed between the low porosity layer and the silicon substrate. In some embodiments, the porous layer is a double porous layer, allowing for easy release or lift-off in a subsequent epi-silicon formation and removal steps. In an embodiment, the HF concentration of the second solution can be in the range of 5%-70%. In an embodiment, the HF concentration of the first solution can be equal to the HF concentration of the second solution.

In one embodiment, a second solution 144 allows for the conduction of the second current 135 through the first silicon substrate 100. In an embodiment, the first solution can include hydrofluoric acid (HF) and isopropyl alcohol (IPA). In another embodiment, the first solution can include hydrofluoric acid (HF) and ethanol. In some embodiments, the second solution 144 is of the same composition as of the first solution 142. In one embodiment, the second current 135 can be approximately equal (e.g., approximately the same direction, approximately the same magnitude, etc.) to the first current 134. In an embodiment, the second current 135 is associated with a low bias voltage, where conducting a high bias voltage and/or a low bias voltage by varying supplied potential voltages can result in either electro-polishing or porosification of a silicon substrate within a single setup.

In an embodiment, multiple silicon substrates can be used in a single tank. In one embodiment, a planar jig can be used to hold together multiple silicon substrates within the same plane. In another embodiment, multiple silicon substrates can be held together in a row, such as in a silicon wafer cassette. Various combinations of batch processing for multiple silicon substrates can be used, where the applications mentioned should not be construed as limiting, and where other techniques for processing multiple silicon substrates can also be applied.

Figure 4:
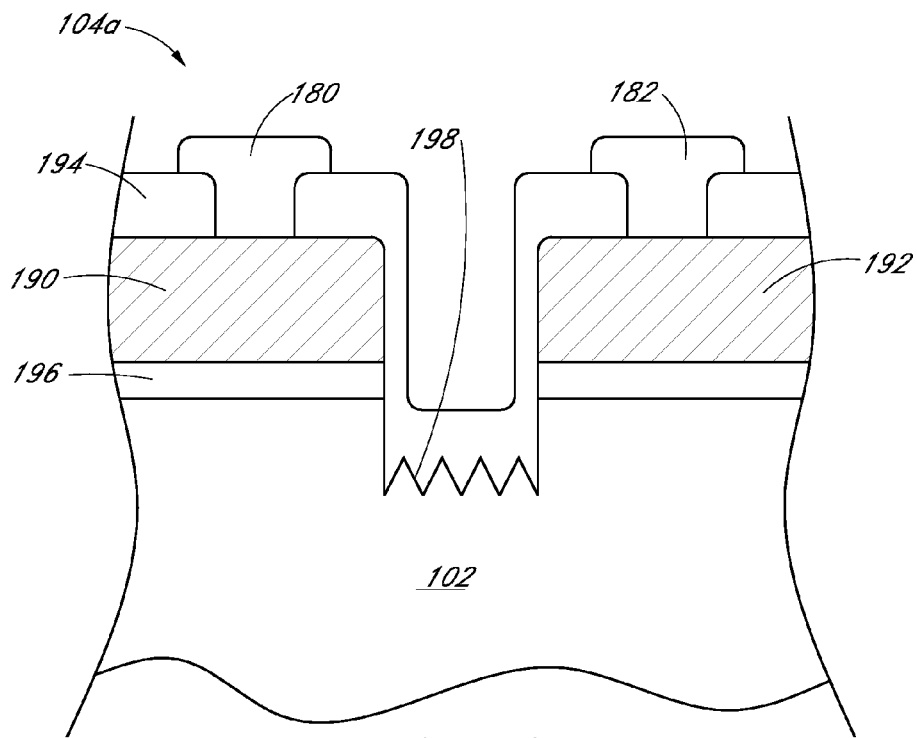
FIGS. 4 and 5 are cross-sectional representations of example solar cells, according to some embodiments.

FIG. 4 illustrates an example solar cell that is fabricated by using the disclosed porous layer on a silicon substrate described above. After forming the porous layer, an epi-silicon layer can be formed over the porous layer. In one embodiment, the porous layer can be in the range of approximately 1-10 microns. In an embodiment, the epi-silicon layer can be in the range of approximately 10-150 microns. After forming the epi-silicon layer, the epi-silicon layer can be removed from the porous layer and silicon substrate, resulting in a silicon wafer 102. The silicon wafer 102 can be cleaned and etched in preparation for subsequent fabrication process, such as a solar cell fabrication process.

For example, for the example solar cell of FIG. 4, a first doped region 190 and a second doped region 192 can be formed through a thermal process on the silicon wafer 102. In another embodiment, the first and second doped regions 190, 192, each include a doping material but is not limited to a positive-type dopant such as boron or a negative-type dopant such as phosphorous. A first dielectric layer 194 can be formed on the first and second doped regions 190, 192. In an embodiment, the first dielectric layer 194 is composed of silicon nitride (SiN). A second dielectric layer 196 can be formed over the silicon wafer 102 prior to forming the first and second doped regions 190, 192. In an embodiment, the second dielectric layer 196 is composed of a tunnel oxide. In another embodiment, both the first and second doped regions 190, 192 include diffusion regions in an interdigitated pattern. In an embodiment, the first and second doped regions are instead first and second doped polysilicon regions.

In one embodiment, a trench region 198 can be formed to separate both the first and second doped regions 190, 192, which can reduce recombination at the interface. In an embodiment, the trench region 198 includes a textured surface for additional collection of light from the back side of the solar cell 104a. A plurality of contact holes can be formed through the first dielectric layer 194 and on the first and second doped regions 190, 192. Contact holes can be formed through a chemical etch, ablation or any industry standard lithography process. An electroplating process can be performed to form a first and second plurality of interdigitated metal contact fingers 180, 182, where the first and second plurality of interdigitated metal contact fingers 180, 182, are electrically coupled to the contact holes through the first dielectric layer 194 on the first and second doped regions 190, 192 respectively. In an embodiment, a texturized region can be formed on the front side of the solar cell 104a for increased solar radiation collection. A texturized region is one which has a regular or an irregular shaped surface for scattering incoming light, decreasing the amount of light reflected back of the surface of the solar cell 104a. In another embodiment, a third dielectric layer can be formed on the texturized region on the front side of the solar cell 104a. In one embodiment, the third dielectric layer is composed of silicon nitride (SiN). In some embodiments, the first 194 and third dielectric layers are anti-reflective layers.

Figure 5:
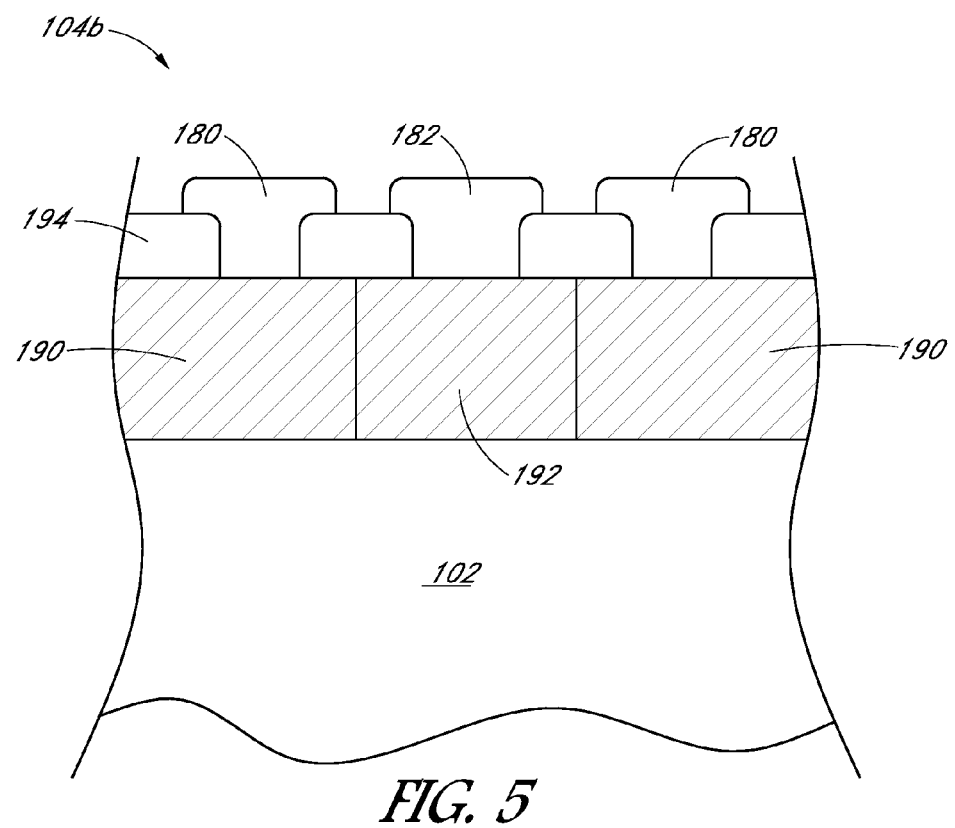

Turning now to FIG. 5, an example solar cell that is fabricated using the disclosed porous layer on a silicon substrate above is shown. Similar to that described in FIG. 4, an epi-silicon layer can be formed over the porous layer. In one embodiment, the porous layer can be approximately in the range of 1-10 microns. In an embodiment, the epi-silicon layer can be approximately in the range of 10-150 microns. After forming the epi-silicon layer, the epi-silicon layer is removed from the porous layer and silicon substrate, resulting in a silicon wafer 102. The silicon wafer 102 can be cleaned and etched in preparation for subsequent fabrication process, such as a solar cell fabrication process.

In an example solar cell fabrication process, a first doped region 190 and a second doped region 192 can be formed through a thermal process on the silicon wafer 102. In another embodiment, the first and second doped regions 190, 192, each include a doping material but is not limited to a positive-type dopant such as boron or a negative-type dopant such as phosphorous. A first dielectric layer 194 can be formed on the first and second doped regions 190, 192. In an embodiment, the first dielectric layer 194 is composed of silicon nitride (SiN). A second dielectric layer can be formed over the silicon wafer 102 prior to forming the first and second doped regions 190, 192. In an embodiment, the second dielectric layer is composed of a tunnel oxide. In another embodiment, both the first and second doped regions 190, 192 include diffusion regions in an interdigitated pattern. In one embodiment, a plurality of contact holes can be formed through the first dielectric layer 194 and on the first and second doped regions 190, 192. Contact holes can be formed through a chemical etch, ablation or any industry standard lithography process. An electroplating process can be performed to form a first and second plurality of interdigitated metal contact fingers 180, 182, where the first and second plurality of interdigitated metal contact fingers 180, 182, are electrically coupled to the contact holes through the first dielectric layer 194 on the first and second doped regions 190, 192 respectively. In an embodiment, a texturized region can be formed on the front side of the solar cell 104*b* for increased solar radiation collection. A texturized region is one which has a regular or an irregular shaped surface for scattering incoming light, decreasing the amount of light reflected back of the surface of the solar cell 104*b*. In one embodiment, a third dielectric layer can be formed on the texturized region on the front side of the solar cell 104*b*. In another embodiment, the third dielectric layer is composed of silicon nitride (SiN). In yet another embodiment, the first 194 and third dielectric layers are anti-reflective layers.

It should be appreciated that the various tasks performed in connection with forming a porous layer on a silicon substrate and subsequently a solar cell manufacturing process can include any number of additional or alternative tasks. The tasks shown in FIG. 1-5 need not be performed in the illustrated order, and additional steps may be incorporated into a more comprehensive procedure or process having additional functionality not described in detail herein.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method, comprising: placing a silicon substrate in a first solution; conducting a first current through the silicon substrate in the first solution; and conducting a second current through the silicon substrate resulting in a porous layer on the silicon substrate, wherein conducting the first current comprises conducting the first current with a current density of 1-100 mA/cm$^2$, resulting in a polished layer on the silicon substrate, wherein the first current flattens a surface of the silicon substrate; and conducting the second current comprises conducting the second current with a current density of 0.1-50 mA/cm$^2$, resulting in a porous layer on the polished layer on the silicon substrate.

2. The method of claim 1, wherein conducting the first current comprises applying a high bias voltage.

3. The method of claim 1, wherein conducting the second current comprises applying a low bias voltage.

4. The method of claim 1, wherein conducting the first current results in electro-polishing the silicon substrate.

5. The method of claim 1, wherein conducting the first current comprises conducting the first current that is based on a size of the silicon substrate.

6. The method of claim 1, wherein conducting the first current comprises conducting the first current that is based on a concentration of the solution.

7. The method of claim 1, wherein conducting the second current comprises conducting the second current that is based on a size of the silicon substrate.

8. The method of claim 1, wherein conducting the second current comprises conducting the second current that is based on a concentration of the solution.

9. The method of claim 1, wherein placing the silicon substrate in the first or second solution comprises placing the silicon substrate in a solution comprised of a chemical selected from the group consisting of hydrofluoric acid (HF), isopropyl alcohol (IPA) and ethanol.

10. The method of claim 1, wherein conducting the second current through the silicon substrate comprises conducting the second current through the silicon substrate in a second solution.

11. The method of claim 10, wherein conducting the second current through the silicon substrate in the second solution comprises conducting the second current through the silicon substrate in a porosification solution.

12. A method for forming a porous layer on a silicon substrate, the method comprising: placing a silicon substrate in a first solution; applying a high bias voltage through the silicon substrate, resulting in a polished layer on the silicon substrate, wherein the high bias voltage flattens a surface of the silicon substrate; placing a silicon substrate in a second solution; and forming a porous layer on the polished layer, wherein forming the porous layer includes applying a low bias voltage through the silicon substrate.

13. The method of claim 12, wherein placing the silicon substrate in the first solution comprises placing the silicon substrate in an electro-polishing solution.

14. The method of claim 12, wherein placing the silicon substrate in the second solution comprises placing the silicon substrate in a porosification solution.

15. The method of claim 12, wherein placing the silicon substrate in the first or second solution comprises placing the silicon substrate in a solution comprised of a chemical selected from the group consisting of hydrofluoric acid (HF), isopropyl alcohol (IPA) and ethanol.

16. A method for forming a porous layer on a silicon substrate, the method comprising: placing a silicon substrate in an electro-polishing solution; electro-polishing the silicon substrate, wherein electro-polishing includes conducting a first current through the silicon substrate, resulting in a polished layer on the silicon substrate, wherein the first current flattens a surface of the silicon substrate; placing the silicon substrate in a porosification solution; and forming a porous layer on the polished layer, wherein forming the porous layer includes conducting a second current through the silicon substrate.

17. The method of claim 16, wherein conducting the first current comprises applying a high bias voltage.

18. The method of claim 16, wherein conducting the second current comprises applying a low bias voltage.

19. The method of claim 16, wherein placing the silicon substrate in the electro-polishing or porosification solution comprises placing the silicon substrate in a solution comprised of a chemical selected from the group consisting of hydrofluoric acid (HF), isopropyl alcohol (IPA) and ethanol.

* * * * *